(12) United States Patent
Han et al.

(10) Patent No.: US 8,698,185 B2
(45) Date of Patent: Apr. 15, 2014

(54) LIGHT EMITTING DEVICE AND LIGHT UNIT HAVING IMPROVED ELECTRODE AND CHIP STRUCTURES WITH CONCAVE/CONVEX SHAPES

(75) Inventors: Jae Cheon Han, Seoul (KR); Jung Hyeok Bae, Seoul (KR); Young Kyu Jeong, Seoul (KR); Da Jeong Song, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 17 days.

(21) Appl. No.: 13/027,949

(22) Filed: Feb. 15, 2011

(65) Prior Publication Data

US 2011/0198659 A1 Aug. 18, 2011

(30) Foreign Application Priority Data

Feb. 17, 2010 (KR) .................. 10-2010-0014161

(51) Int. Cl.
*H01L 33/48* (2010.01)
(52) U.S. Cl.
USPC ................... 257/99; 257/E33.057
(58) Field of Classification Search
USPC ................... 257/13, 79–103, 918, 257/E51.018–E51.022, E33.001–E33.077, 257/E33.054, E25.028, E25.032, 739, 745, 257/753, 773, 775, E23.142, E23.143, 257/E23.145, E23.146, E23.152, E23.16, 257/E23.168, E23.169, E23.175, E21.627, 257/E21.641
See application file for complete search history.

(56) References Cited

U.S. PATENT DOCUMENTS

| | | | |
|---|---|---|---|
| 6,956,242 B2 | 10/2005 | Tsutsui | |
| 2006/0113681 A1 | 6/2006 | Jeong et al. | |
| 2007/0278511 A1* | 12/2007 | Ohno et al. | 257/99 |
| 2008/0035948 A1 | 2/2008 | Shin et al. | |
| 2008/0054290 A1 | 3/2008 | Shieh et al. | |
| 2008/0061315 A1 | 3/2008 | Hata | |
| 2009/0095975 A1 | 4/2009 | Shin et al. | |
| 2009/0315056 A1 | 12/2009 | Kim | |
| 2010/0123148 A1* | 5/2010 | Park | 257/94 |
| 2010/0270579 A1 | 10/2010 | Jo | |

FOREIGN PATENT DOCUMENTS

| | | |
|---|---|---|
| CN | 101034726 A | 9/2007 |
| CN | 101877382 A | 11/2010 |
| JP | 2004-39983 A | 2/2004 |
| KR | 10-0755658 B1 | 9/2007 |
| KR | 10-2008-0041794 A | 5/2008 |
| KR | 10-2009-0039261 A | 4/2009 |
| TW | M374006 U1 | 2/2010 |

\* cited by examiner

*Primary Examiner* — Selim Ahmed

(74) *Attorney, Agent, or Firm* — Birch, Stewart, Kolasch & Birch, LLP

(57) ABSTRACT

Provided are a light emitting device and a light unit. The light emitting device includes a package body including a body, a plurality of electrodes on the body, and a concave portion on at least one of the plurality of electrodes, a light emitting chip including a convex portion corresponding to the concave portion to couple and attach the concave portion to the convex portion, the light emitting chip including a first conductive type semiconductor layer, a second conductive type semiconductor layer, and an active layer between the first conductive type semiconductor layer and the second conductive type semiconductor layer, and an adhesion layer on a bottom surface of the light emitting chip.

20 Claims, 8 Drawing Sheets

LIGHT EMITTING DEVICE AND LIGHT UNIT HAVING IMPROVED ELECTRODE AND CHIP STRUCTURES WITH CONCAVE/CONVEX SHAPES

CROSS-REFERENCE TO RELATED APPLICATIONS

The present application claims priority of Korean Patent Application No. 10-2010-0014161 filed on Feb. 17, 2010, which is hereby incorporated by reference in its entirety.

BACKGROUND

Embodiments relate to a light emitting device and a light unit.

Light emitting diodes (LEDs) are semiconductor light emitting devices that convert current into light. As luminance of LEDs is increased recently, the LEDs are being used as light sources for displays, vehicles, and illuminations. Also, LEDs emitting highly efficient white light may be realized by using a fluorescent substance or combining LEDs having various colors.

SUMMARY

Embodiments provide a light emitting device having a new structure and a light unit.

Embodiments also provide a light emitting device having improved reliability and a light unit.

In one embodiment, a light emitting device includes: a package body including a body, a plurality of electrodes on the body, and a concave portion on at least one of the plurality of electrodes; a light emitting chip including a convex portion at a lower surface thereof corresponding to the concave portion to couple and attach the concave portion to the convex portion, the light emitting chip including a first conductive type semiconductor layer, a second conductive type semiconductor layer, and an active layer between the first conductive type semiconductor layer and the second conductive type semiconductor layer; and an adhesion layer on a lower surface of the light emitting chip.

In another embodiment, a light emitting device includes: a package body comprising a body, a plurality of electrodes on the body, and a concave portion on at least one of the plurality of electrodes; a light emitting chip including a convex portion at a lower surface thereof corresponding to the concave portion, wherein the light emitting chip includes a first conductive type semiconductor layer, an active layer, and a second conductive type semiconductor layer; and an adhesion layer on the lower surface of the light emitting chip, wherein the light emitting chip includes a conductive support member under the first conductive type semiconductor layer, the active layer, and the second conductive type semiconductor layer, and wherein the convex portion is formed on a lower surface of the conductive support member.

The details of one or more embodiments are set forth in the accompanying drawings and the description below. Other features will be apparent from the description and drawings, and from the claims.

DETAILED DESCRIPTION OF THE EMBODIMENTS

Figure 1:
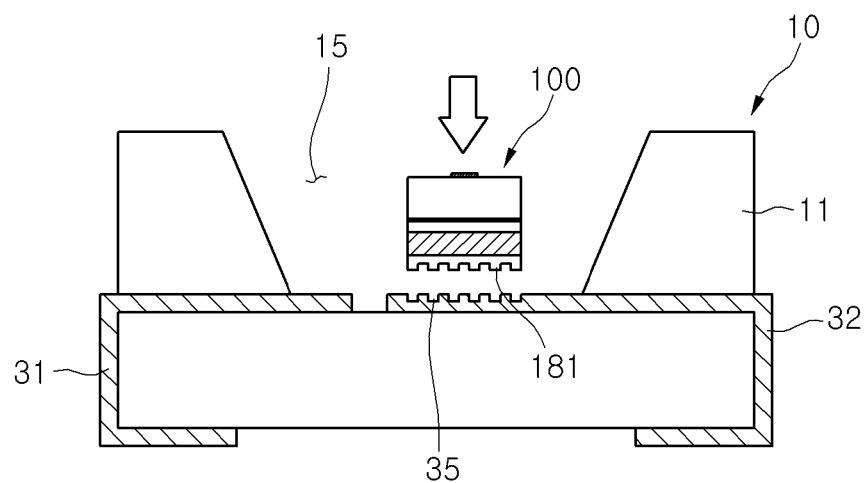
FIG. 1 is a view of a light emitting device according to a first embodiment.

In the descriptions of embodiments, it will be understood that when a layer (or film), a region, a pattern, or a structure is referred to as being 'on' a substrate, a layer (or film), a region, a pad, or patterns, it can be directly on another layer or substrate, or intervening layers may also be present. Further, it will be understood that when a layer is referred to as being 'under' another layer, it can be directly under another layer, and one or more intervening layers may also be present. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device and a light unit according to embodiments will be described with reference to accompanying drawings.

<First Embodiment>

FIG. 1 is a view of a light emitting device according to a first embodiment.

Referring to FIG. 1, a light emitting device according to a first embodiment includes a body 11, a plurality of electrodes 31 and 32 disposed on the body 11, a package body 10 including a concave portion 35 disposed on at least one of the plurality of electrodes 31 and 32, and a light emitting chip 100 including a convex portion 181 at a lower surface thereof corresponding to the concave portion 35 and attached to the package body 10.

The body 11 constitutes a body of the package body 10. The body 11 may be formed of silicon (Si), aluminum (Al), aluminum nitride (AlN), Alo$_x$, photo sensitive glass (PSG), sapphire (Al$_2$O$_3$), beryllium oxide, a printed circuit board (PCB), or various resins, but is not limited thereto.

For example, the body 11 may be manufactured using injection molding, or a plurality of layers may be stacked to manufacture the body.

A cavity 15 having an opened upper side may be defined in the body 11. For example, the cavity 15 may be formed by injection molding or etching.

The cavity 15 may have a cup shape and a concave container shape. The cavity 15 may have a vertical or inclined inner side surface. Also, the cavity 15 may have a surface configuration such as a circular shape, a square shape, a polygonal shape, or an oval shape.

Although not shown, when the body 11 is formed of a material having conductivity, an insulation layer may be disposed on a surface of the body 11. The insulation layer may prevent the light emitting device from being electrically shorted.

The plurality of electrodes 31 and 32 may be disposed on the body 11. For example, the plurality of electrodes 31 and 32 may include a first electrode 31 and a second electrode 32. The first electrode 31 and the second electrode 32 respectively are electrically separated into a positive pole and a negative pole to provide a power to the light emitting chip 100.

For example, the first and second electrodes 31 and 32 may be formed of a metal containing at least one of Ti, Cu, Ni, and Au. Also, the first and second electrodes 31 and 32 may be selectively manufactured using a plating method, a deposition method, or a photolithograph process, but is not limited thereto.

The concave portion 35 may be disposed on at least one of the plurality of electrodes 31 and 32. The concave portion 35 may be changed in position according to an electrode structure of the light emitting chip 100 and/or a design of the package body 10.

For example, a mask pattern may be formed using a photolithograph process, and then an etching process may be performed along the mask pattern to form the concave portion 35, but is not limited thereto.

The concave portion 35 may have a shape corresponding to that of the convex portion 181 disposed on the lower surface of the light emitting chip 100. The concave portion 35 may be formed in a plurality and the convex portion 181 may be formed in a plurality.

Thus, the convex portion 181 disposed on the lower surface of the light emitting chip 100 may be attached to the package body 10 by being coupled the concave portion 35.

Here, the concave portion 35 and the convex portion 181 may be engaged with each other to firmly fix the light emitting chip 100 on the package body 10 without being twisted out of position.

In detail, the light emitting chip 100 is attached to the package body 10 by eutectic bonding or bonding using a bonding paste. In the eutectic bonding or the bonding using an adhesion layer such as an adhesive formed of a resin material, the light emitting chip 100 may not be accurately attached in a desired position and thus is slightly twisted out of the desired position.

Thus, in the light emitting device according to the current embodiment, since the concave portion 35 and the convex portion 181 are respectively disposed on the package body 10 and the light emitting chip 100, it may prevent the light emitting chip 100 from being twisted in the eutectic bonding or the bonding using the adhesion layer such as the adhesive formed of the resin material. Therefore, reliability of the light emitting device may be improved.

Hereinafter, a structure of the light emitting chip 100 will be described in detail.

Figure 2:
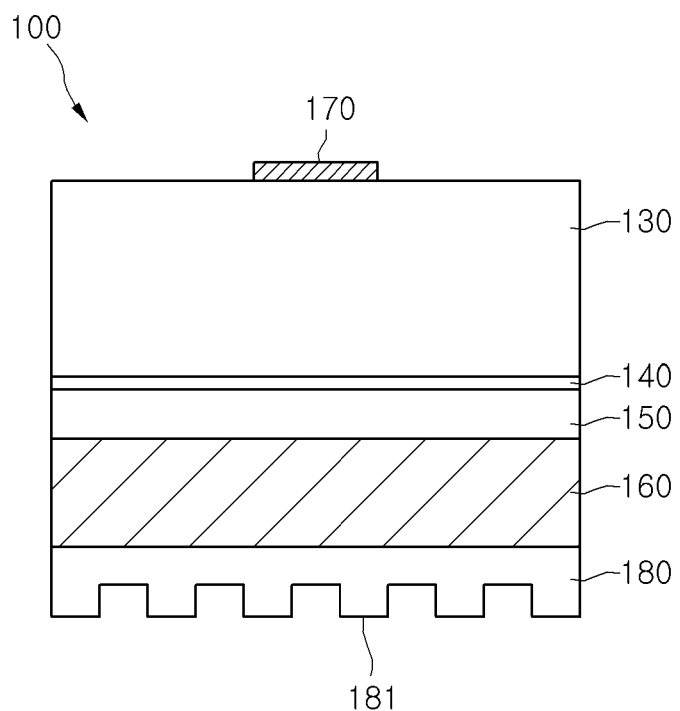
FIGS. 2 and 3 are sectional views of a light emitting chip attached to the light emitting device of FIG. 1.
Figure 3:
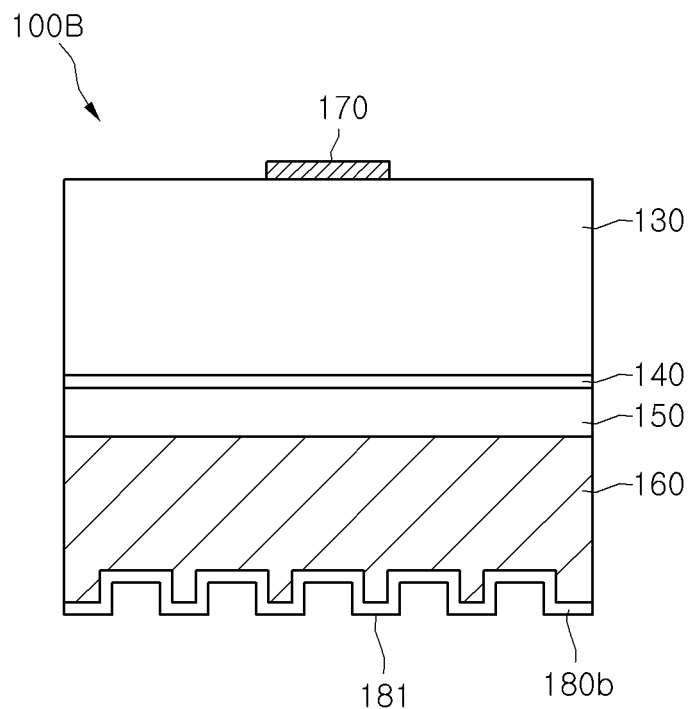

FIG. 2 is a sectional view of the light emitting chip 100 according to the first embodiment, and FIG. 3 is a sectional view of a light emitting chip 100B according to another embodiment.

Referring to FIG. 2, the light emitting chip 100 includes a first conductive type semiconductor layer 130, a first electrode unit 170 on the first conductive type semiconductor layer 130, an active layer 140 under the first conductive type semiconductor layer 130, a second conductive type semiconductor layer 150 under the active layer 140, a conductive support member 160 under the second conductive type semiconductor layer 150, and an adhesion metal layer 180 including the convex portion 181 under the conductive support member 160

The first electrode unit 170 and the conductive support member 160 provide a power to the light emitting chip 100.

The first conductive type semiconductor layer 130, the active layer 140, and the second conductive type semiconductor layer 150 constitute at least light emitting structure for generating light.

The light emitting structure may be manufactured using a metal organic chemical vapor deposition (MOCVD) process, a chemical vapor deposition (CVD) process, a plasma-enhanced chemical vapor deposition (PECVD) process, a molecular beam epitaxy (MBE) process, or a hydride vapor phase epitaxy (HVPE) process, but is not limited thereto.

For example, the first conductive type semiconductor layer 130 may include an n-type semiconductor layer. The n-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., at least one of InAlGaN, GaN, AlGaN, InGaN, AlN, and InN. Here, the n-type semiconductor layer is doped with an n-type dopant such as Si, Ge, and Sn.

The active layer 140 may be disposed under the first conductive type semiconductor layer 130. The active layer 140 is a layer in which electrons (or holes) injected through the first conductive type semiconductor layer 130 and electrons (or holes) injected through the second conductive type semiconductor layer 150 may be meet with each other to emit light by a band gap difference of an energy band depending on a formation material of the active layer 140.

The active layer 140 may have a single quantum well structure or a multi quantum well (MQW) structure, but is not limited thereto.

The active layer 140 may be formed of a semiconductor material having a composition formula of $In_xAl_yGa_{1-x-y}N$ ($0 \leq x \leq 1$, $0 \leq y \leq 1$, $0 \leq x+y \leq 1$). When the active layer 140 has the MQW structure, a plurality of well layers and a plurality of barrier layers may be stacked to manufacture the active layer 140. For example, the active layer 140 may be formed of at a cycle of an InGaN well layer/GaN barrier layer.

The second conductive type semiconductor layer 150 is disposed under the active layer 140. For example, the second conductive type semiconductor layer 150 may be realized as a p-type semiconductor layer. The p-type semiconductor layer may be formed of a semiconductor material having a compositional formula of $In_xAl_yGa_{1-x-y}N$ ($0 \leq x \leq 1$, $0 \leq y \leq 1$, $0 \leq x+y \leq 1$), e.g., InAlGaN, GaN, AlGaN, InGaN, AlN, or InN. Also, the p-type semiconductor layer may be doped with the p-type dopant such as Mg, Zn, Ca, Sr, Ba, etc.

The conductive support member 160 may be disposed under the second conductive type semiconductor layer 150. The conductive support member 160 may be formed of at least one of Ti, Cr, Ni, Al, Pt, Au, W, Cu, and Mo, or may include a semiconductor substrate in which impurities are injected.

The conductive support member 160 may be manufactured using at least one of plating, coating, and deposition. Alternatively, the conductive support member 160 may be prepared in a sheet shape and adhere to the second conductive type semiconductor layer 150, but is not limited thereto.

The adhesion metal layer 180 may be disposed under the conductive support member 160. The adhesion metal layer 180 may serve as an adhesion layer. For example, the adhesion metal layer 180 may be formed of at least one of Ti, Au, Sn, Ni, Cr, Ga, In, Bi, Cu, Ag, and Ta.

The convex portion 181 may be disposed on the lower surface of the adhesion metal layer 180. For example, an etching process may be performed along a mask pattern after the mask pattern is formed by a photolithograph process, but is not limited thereto.

The convex portion 181 may have a shape corresponding to that of the concave portion 35 disposed on the package body 10. Also, each of the first and convex portions 35 and 181 may have a regular or irregular distance.

As described above, since the convex portion 181 is disposed on the lower surface of the light emitting chip 100, it may prevent the light emitting chip 100 from being twisted when the light emitting chip 100 is bonded to the package body 10.

Specifically, since the convex portion 181 is disposed on the lower surface of the light emitting chip 100, the light emitting chip 100 may be bonded at a desired position on the package body 10 without being twisted when the eutectic bonding in which heat or pressure is applied to the adhesion metal layer 180 to bond the light emitting chip 100 to the package body 10 or the bonding using a conductive adhesive are performed. Also, the convex portion 181 may have a relatively large area to be coupled to the concave portion 35 to more effectively transfer heat.

The convex portion 181 is not absolutely disposed on only the adhesion metal layer 180.

For example, as shown in FIG. 3, since a third pattern corresponding to the convex portion 181 may be disposed on the conductive support member 160 and an adhesion metal layer 180b is disposed on the conductive support member 160 including the third pattern, the convex portion 181 may be provided. The adhesion metal layer 180b may have a uniform thickness on the third pattern of the conductive support member 160.

Also, when the light emitting chip 100 is bonded to the package body 10 using a conductive adhesive, the convex portion 181 may be disposed on the conductive support member 160, but the adhesion metal layer 180 may not be disposed on the conductive support member 160.

Figure 4:
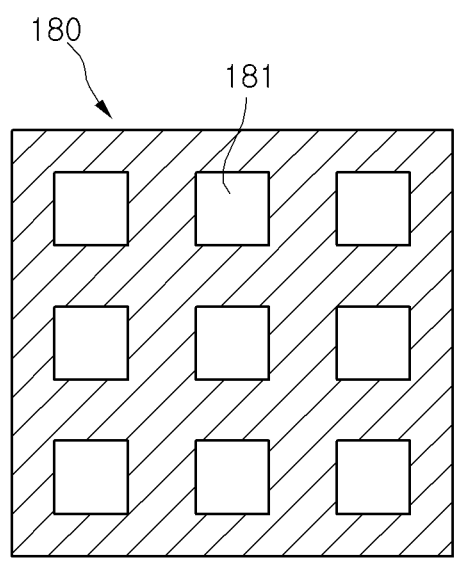
FIGS. 4 and 5 are views illustrating various examples of a convex portion disposed on the light emitting chip.
Figure 5:
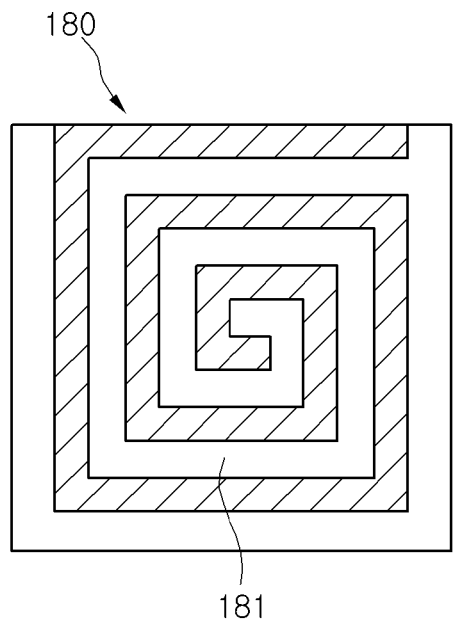

FIGS. 4 and 5 are views illustrating various examples of the convex portion 181 disposed on the light emitting chip.

Referring to FIG. 4, the convex portion 181 may have a lattice pattern shape in which a plurality of squares is arranged in a matrix. Alternatively, as shown in FIG. 5, the convex portion 181 may have a spiral pattern shape.

That is, the convex portion 181 may have various shapes according to a design of the light emitting chip 100, but is not limited thereto.

<Second Embodiment>

Hereinafter, a light emitting device according to a second embodiment will be described in detail. In descriptions of the second embodiment, the descriptions of portions duplicated with those of the first embodiment will be omitted or simply described.

Figure 6:
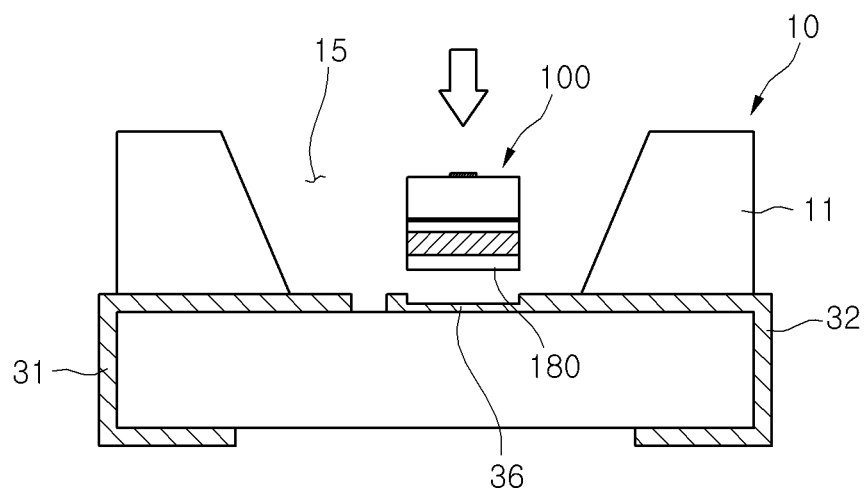
FIG. 6 is a view of a light emitting device according to a second embodiment.

FIG. 6 is a view of a light emitting device according to a second embodiment.

Referring to FIG. 6, a light emitting device according to a second embodiment includes a body 11, a plurality of electrodes 31 and 32 disposed on the body 11, a package body 10 including a concave portion 36 disposed on at least one of the body 11 and the plurality of electrodes 31 and 32, and a light emitting chip 100 attached to the concave portion 36.

Figure 7:
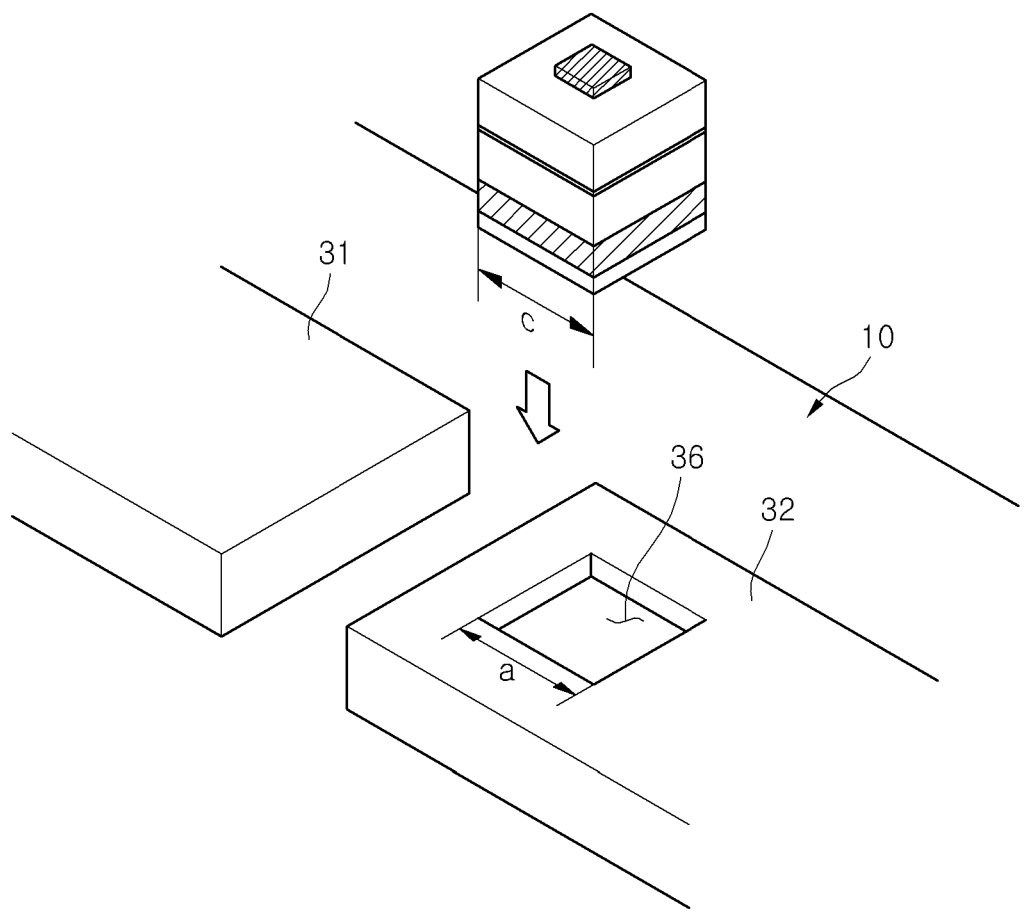
FIG. 7 is a view illustrating a process of attaching a light emitting chip to a package body.

FIG. 7 is a view illustrating a process of attaching the light emitting chip 10 to a package body.

Referring to FIG. 7, one concave portion 36 may have a shape corresponding to that of a lower surface of the light emitting chip 100.

Specifically, the concave portion may have an area (a) greater than or equal to that (c) of the lower surface of the light emitting chip 100. For example, the concave portion 36 may have an area (a) equal to or greater by about 1.5 times than that (c) of the lower surface of the light emitting chip 100.

Since the light emitting chip 100 is bonded and attached within the concave portion 36, it may prevent the light emitting chip 100 from being twisted due to an inner wall of the concave portion 36 when the light emitting chip 100 is bonded through eutectic bonding or bonding using an adhesive.

That is, in the light emitting device according to the second embodiment, the one concave portion 36 instead of the concave portion and convex portion of the first embodiment may be provided to prevent the light emitting chip 100 from being twisted during the bonding.

Also, in the light emitting device according to the second embodiment, since it is not necessary to dispose separate pattern on the lower surface of the light emitting chip 100, the light emitting device manufacturing process may be simplified when compared to that in the first embodiment.

<Third Embodiment>

Hereinafter, a light emitting device according to a third embodiment will be described in detail. In descriptions of the third embodiment, the descriptions of portions duplicated with those of the first embodiment will be omitted or simply described.

Figure 8:
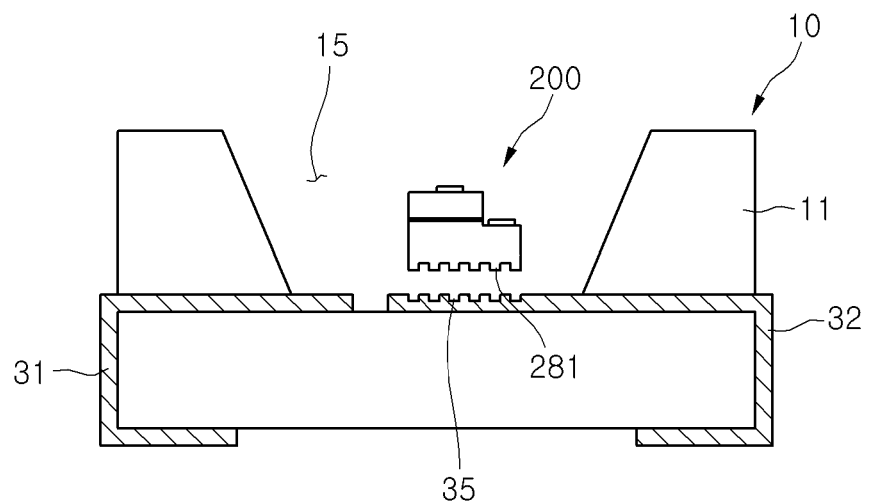
FIG. 8 is a view of a light emitting device according to a third embodiment.

FIG. 8 is a view of a light emitting device according to a third embodiment.

Referring to FIG. 8, a light emitting device according to a third embodiment includes a body 11, a plurality of electrodes 31 and 32 disposed on the body 11, a package body 10 including a concave portion 35 disposed on at least one of the plurality of electrodes 31 and 32, and a light emitting chip 200 including a convex portion 281 having a bottom surface thereof corresponding to the concave portion 35 and attached to the package body 10.

Figure 9:
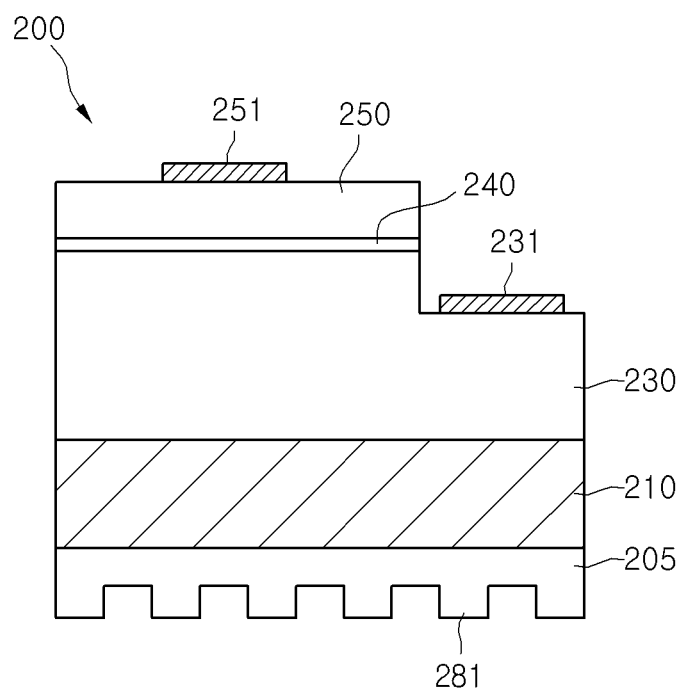
FIGS. 9 and 10 are sectional views of a light emitting chip attached to the light emitting device of FIG. 8.

FIG. 9 is a sectional view of a light emitting chip 200.

Referring to FIG. 9, the light emitting chip 200 may include a substrate 210, a first conductive type semiconductor layer 230 on the substrate 210, an active layer 240 on the first conductive type semiconductor layer 230, a second conductive type semiconductor layer 250 on the active layer 240, first and second electrode units 231 and 252 respectively disposed on the first and second conductive type semiconductor layers 230 and 250, and a reflective layer 205 including the convex portion 281 under the substrate 210.

The substrate 210 may be formed of at least one of sapphire ($Al_2O_3$), SiC, Si, GaAs, GaN, ZnO, Si, GaP, InP, and Ge, but is not limited thereto. The substrate 210 may include an insulating material.

The first conductive type semiconductor layer 230, the active layer 240, and the second conductive type semiconductor layer 250 may be sequentially disposed on the substrate 210.

A reflective layer 205 including the convex portion 281 may be disposed under the substrate 210. The reflective layer 205 may be formed of a metal having high reflective efficiency and including at least one of Ag, Al, Pd, Cu, and Pt or an alloy thereof.

Also, the light emitting chip 200 may be attached to the package body 10 through eutectic bonding or bonding using an adhesion layer such as an adhesive formed of a resin material.

When the substrate 210 is formed of a transparent material, the reflective layer 205 may reflect light emitted from the active layer 240. Thus, when the substrate 210 is formed of an opaque material, the reflective layer 205 may not be provided. Here, the convex portion 281 may be disposed on a lower surface of the substrate 210.

Figure 10:
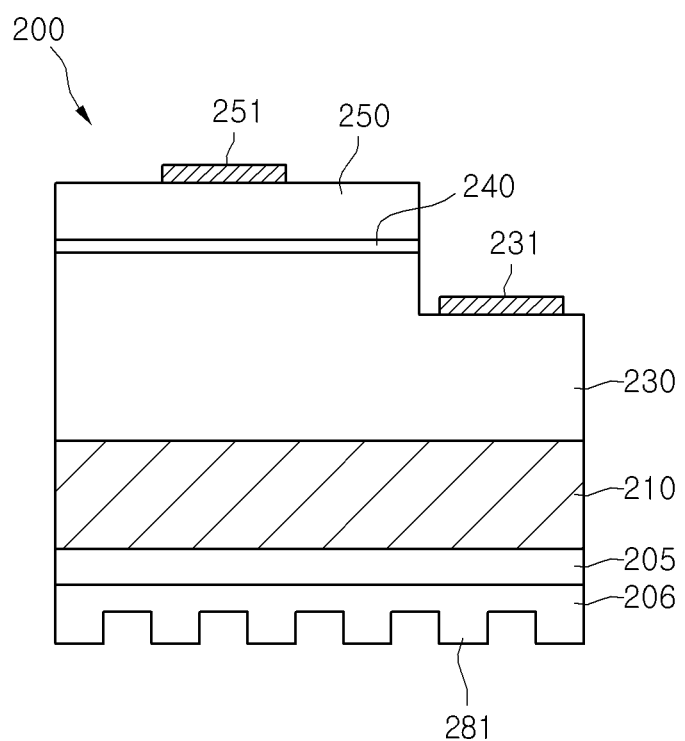

Also, as shown in FIG. 10, an adhesion metal layer 206 may be further disposed on a lower surface of the reflective layer 205. Also, the convex portion 281 may be disposed on the adhesion metal layer 206, but is not limited thereto.

In the light emitting device according to the current embodiment, the first and convex portions 35 and 281 may be respectively disposed on the package body 10 and the light emitting chip 200 to prevent the light emitting chip 200 from being twisted during the eutectic bonding or the bonding using the adhesion layer such as the adhesive formed of the resin material. Therefore, reliability of the light emitting device may be improved.

Figure 11:
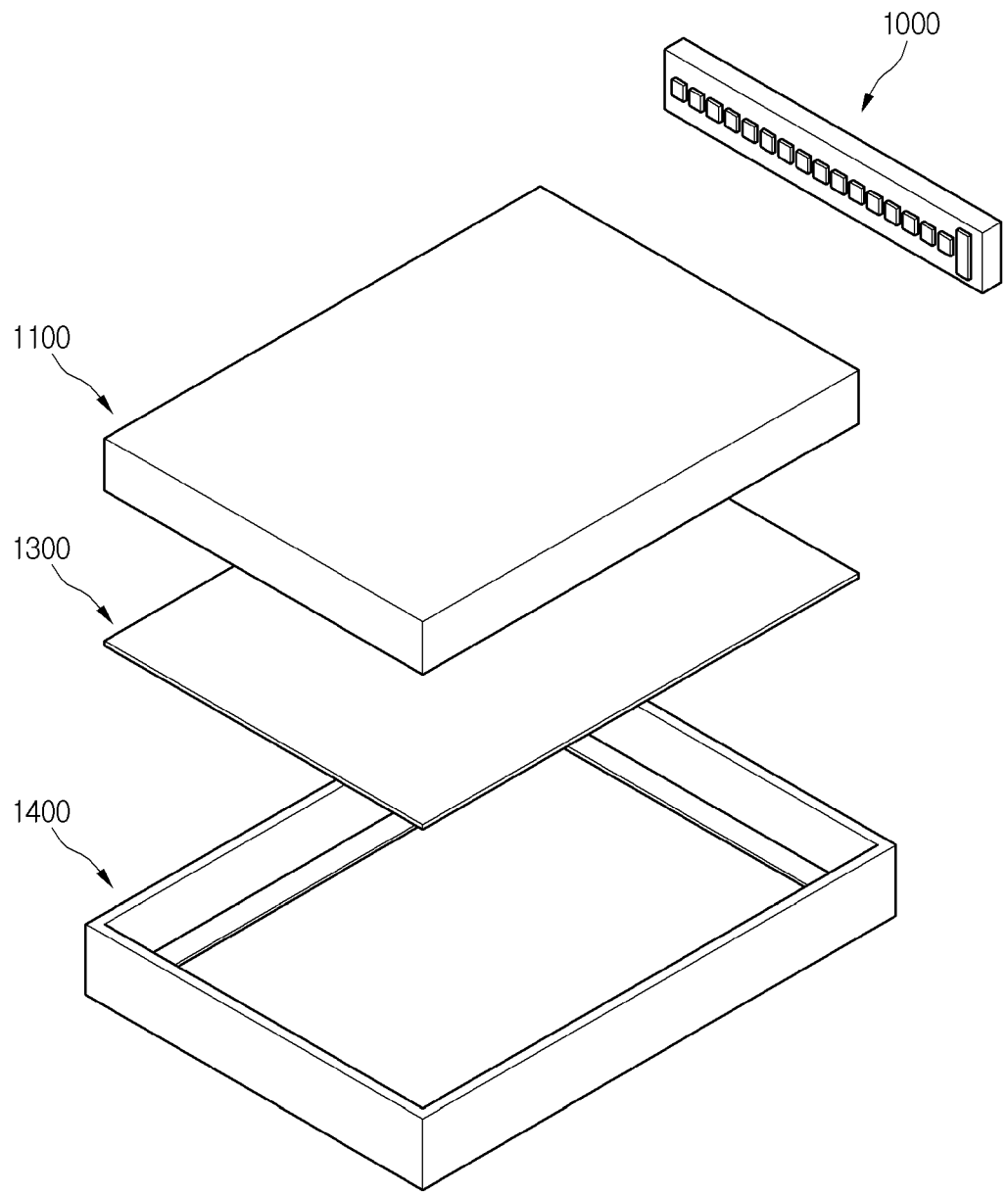
FIGS. 11 and 12 are views of a light unit using a light emitting device according to an embodiment.

FIG. 11 is view of a backlight unit using a light emitting device according to an embodiment. However, the backlight unit of FIG. 11 may be an example of a light unit, and thus, the present disclosure is not limited thereto.

Referring to FIG. 11, the backlight unit may include a bottom cover 1400, a light guide member 1100 disposed within the bottom cover 1400, and a light emitting module 1000 disposed on at least one side surface or a bottom surface of the light guide member 1100. Also, a reflective sheet 1300 may be disposed under the light guide member 1100.

The bottom cover 1400 may have an upwardly opened box shape to receive the light guide member 1100, the light emitting module 1000, and the reflective sheet 1300. Also, the bottom cover 1400 may be formed of a metal material or a resin material, but is not limited thereto.

The light emitting module 1000 may include a board and a plurality of light emitting devices mounted on the board. The plurality of light emitting devices according to an embodiment may provide light to the light guide member 1100.

As shown in FIG. 11, the light emitting module 1000 may be disposed on at least one of inner side surfaces of the bottom cover 1400, and thus, the light emitting module 1100 may provide light toward at least one side surface of the light guide member 1100.

Alternatively, the light emitting module 1000 may be disposed on a bottom surface of the bottom cover 1400 to provide light toward a bottom surface of the light guide member 1100. Since this structure may be variously varied according to a design of the backlight unit, the present disclosure is not limited to the above-described structure.

The light guide member 1100 may be disposed inside the bottom cover 1400. The light guide member 1100 may receive the light provided from the light emitting module 1000 to produce planar light, and then guide the planar light to a display panel (not shown).

When the light emitting module 1000 is disposed on the side surface of the light guide member 1100, the light guide member 1100 may be a light guide panel (LGP).

For example, the light guide panel (LGP) may be formed of one of an acryl-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

When the light emitting module 1000 is disposed on the bottom surface of the light guide member 1100, the light guide member 1100 may include at least one of the light guide panel or the optical sheet.

For example, the optical sheet may include at least one of a diffusion sheet, a light collection sheet, and a brightness enhanced sheet. For example, the diffusion sheet, the light collection sheet, and the brightness enhanced sheet may be sequentially stacked to form the optical sheet. In this case, the diffusion sheet may uniformly diffuse light emitted from the light emitting module 1000, and then the diffused light may be collected into the display panel (not shown) by the light collection sheet. Here, the light emitted from the light collection sheet may be randomly polarized light. The bright enhanced sheet may enhance a degree of polarization of the light emitted from the light collection sheet. For example, the light collection sheet may be a horizontal and/or vertical prism sheet. Also, the bright enhanced sheet may be a dual brightness enhancement film.

The reflective sheet 1300 may be disposed under the light guide member 1100. The reflective sheet 1300 may reflects the light emitted through the bottom surface of the light guide member 1100 toward a light emitting surface of the light guide member 1100.

The reflective sheet 1300 may be formed of a material having superior reflectance, e.g., a PET resin, a PC resin, or a PVC resin, but is not limited thereto.

Figure 12:
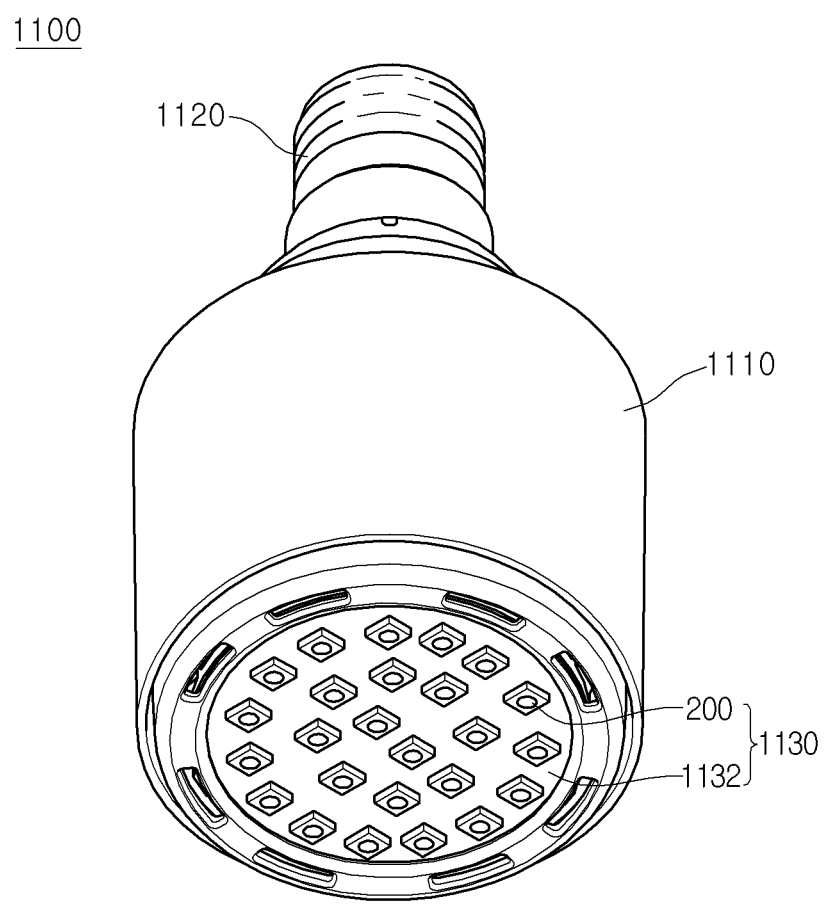

FIG. 12 is a view of a lighting unit 1100 using a light emitting device 200 according to an embodiment. The lighting unit of FIG. 12 is an example of a light unit, but is not limited thereto.

Referring to FIG. 12, the lighting unit 1100 may include a case body 1110, a light emitting module 1130 disposed on the case body 1110, a connection terminal 1120 disposed on the case body 1110 to receive a power from an external power source.

The case body 1110 may be formed of a material having good thermal dissipation properties, e.g., a metal material or a resin material.

The light emitting module 1130 may include a board 1132 and at least one light emitting device 200 mounted on the board 1132.

A circuit pattern may be printed on a dielectric to manufacture the board 1132. For example, the board 1132 may include a printed circuit board (PCB), a metal core PCB, a flexible PCB, and a ceramic PCB.

Also, the board 1132 may be formed of an effectively reflective material or have a color on which light is effectively reflected from a surface thereof, e.g., a white color or a silver color.

At least one light emitting device 200 may be mounted on the board 1132. The light emitting device 200 may include at least one light emitting diode (LED). The LED may include color LEDs, which respectively emit light having a red color, a green color, a blue color, and a white color and an ultraviolet (UV) LED emitting UV rays.

The light emitting module 1130 may have various combinations of the LEDs to obtain color impression and brightness. For example, the white LED, the red LED, and the green LED may be combined with each other to secure a high color rendering index (CRI).

The connection terminal 1120 may be electrically connected to the light emitting module 1130 to provide a power to the light emitting module 1230. Referring to FIG. 12, the connected terminal 1120 is screw-coupled to an external power source in a socket manner, but is not limited thereto. For example, the connection terminal 1120 may have a pin shape, and thus, be inserted into the external power source. Alternatively, the connection terminal 1120 may be connected to the external power source by an interconnection.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a package body comprising a body having a recess, a plurality of electrodes on the body, and a concave portion on at least one of the plurality of electrodes, the concave portion disposed at the recess;
a light emitting chip disposed at the recess, the light emitting chip including a convex portion at a lower surface thereof corresponding to the concave portion to couple and attach the concave portion to the convex portion; and
an adhesion layer on the lower surface of the light emitting chip,
wherein the light emitting chip includes a light emitting structure and a first electrode on a top surface of the light emitting structure, and
wherein a bottom surface of the light emitting structure has a flat surface.

2. The light emitting device of claim 1, wherein the adhesion layer comprises an adhesion metal layer formed of a metal material.

3. The light emitting device of claim 1, wherein the adhesion layer is formed of a resin material.

4. The light emitting device of claim 1, wherein the concave portion has an area greater than or equal to that of the lower surface of the light emitting chip.

5. The light emitting device of claim 1, wherein the concave portion has an area equal to or greater by about 1.5 times than that of the lower surface of the light emitting chip.

6. The light emitting device of claim 1, wherein the body under the concave portion has a flat top surface.

7. The light emitting device of claim 1, wherein the convex portion comprises a lattice pattern or a spiral pattern.

8. The light emitting device of claim 1, wherein the adhesion layer comprises an adhesion metal layer formed of a metal material, and the convex portion is disposed on the adhesion metal layer.

9. The light emitting device of claim 1, wherein each of the concave portion and the convex portion has a regular or irregular distance in a plurality.

10. The light emitting device of claim 2, wherein the adhesion metal layer is formed of at least one of Ti, Au, Sn, Ni, Cr, Ga, In, Bi, Cu, Ag, and Ta.

11. The light emitting device of claim 1, wherein the light emitting chip includes a first conductive type semiconductor layer, an active layer, and a second conductive type semiconductor layer,
wherein the light emitting chip further includes a conductive support member under the first conductive type semiconductor layer, the active layer, and the second conductive type semiconductor layer,
wherein the conductive support member is disposed between the second conductive type semiconductor layer and the adhesion layer.

12. A light emitting device comprising:
a package body comprising a body having a recess, a plurality of electrodes on the body, and a concave portion on at least one of the plurality of electrodes, the concave portion disposed at the recess;
a light emitting chip disposed at the recess, the light emitting chip including a convex portion at a lower surface thereof corresponding to the concave portion, wherein the light emitting chip includes a light emitting structure including a first conductive type semiconductor layer, an active layer, and a second conductive type semiconductor layer; and
an adhesion layer on the lower surface of the light emitting chip,
wherein the light emitting chip includes a conductive support member under the first conductive type semiconductor layer, the active layer, and the second conductive type semiconductor layer,
wherein the convex portion is formed on a lower surface of the conductive support member,
wherein the light emitting chip includes the light emitting structure and a first electrode on a top surface of the light emitting structure, and
wherein a bottom surface of the light emitting structure has a flat surface.

13. The light emitting device of claim 12, wherein the adhesion layer comprises an adhesion metal layer formed of a metal material.

14. The light emitting device of claim 12, wherein the adhesion layer is disposed with a uniform thickness on the lower surface of the conductive support member.

15. The light emitting device of claim 12, wherein the body under the concave portion has a flat top surface.

16. The light emitting device of claim 12, wherein the convex portion comprises a lattice pattern or a spiral pattern.

17. A light emitting device comprising:
a package body comprising a body, a plurality of electrodes on the body, and a first concave-convex portion on at least one of the plurality of electrodes;
a light emitting chip including a second concave-convex portion at a lower surface thereof corresponding to the first concave-convex portion, wherein the light emitting chip includes a reflective layer, a substrate on the reflective layer, a first conductive type semiconductor layer, an active layer, and a second conductive type semiconductor layer on the substrate,
wherein the first concave-convex portion includes a plurality of protrusions and a plurality of recesses,
wherein the second concave-convex portion includes a plurality of protrusions and a plurality of recesses,
wherein a shape of the plurality of protrusions of the first concave-convex portion corresponds to a shape of the plurality of recesses of the second concave-convex portion, and
wherein a shape of the plurality of recesses of the first concave-convex portion corresponds to a shape of the plurality of protrusions of the second concave-convex portion.

18. The light emitting device of claim 17, wherein the second concave-convex portion is formed on a lower surface of the reflective layer.

19. The light emitting device of claim 17, further comprising an adhesion layer on the lower surface of the reflective layer.

20. The light emitting device of claim 17, wherein the substrate includes an insulating material.

\* \* \* \* \*